United States Patent
Zimmermann et al.

(10) Patent No.: US 10,164,385 B2
(45) Date of Patent: Dec. 25, 2018

(54) HIGH DENSITY COMMUNICATIONS DEVICE

(71) Applicant: ZPE Systems, Inc., Fremont, CA (US)

(72) Inventors: Arnaldo Zimmermann, Dublin, CA (US); Livio Ceci, Fremont, CA (US)

(73) Assignee: ZPE SYSTEMS, INC., Fremont, CA (US)

( * ) Notice: Subject to any disclaimer, the term of this patent is extended or adjusted under 35 U.S.C. 154(b) by 0 days.

(21) Appl. No.: 15/862,582

(22) Filed: Jan. 4, 2018

(65) Prior Publication Data

US 2018/0145468 A1 May 24, 2018

Related U.S. Application Data

(63) Continuation of application No. 15/372,134, filed on Dec. 7, 2016, now Pat. No. 9,905,980, which is a continuation of application No. 15/063,838, filed on Mar. 8, 2016.

(60) Provisional application No. 62/130,491, filed on Mar. 9, 2015, provisional application No. 62/144,870, filed on Apr. 8, 2015.

(51) Int. Cl.
| | |
|---|---|
| *H05K 5/02* | (2006.01) |
| *H01R 24/64* | (2011.01) |
| *H04L 12/24* | (2006.01) |
| *H04L 29/06* | (2006.01) |
| *H05K 5/03* | (2006.01) |
| *H05K 7/14* | (2006.01) |
| *G06F 13/42* | (2006.01) |
| *H04L 12/26* | (2006.01) |

(52) U.S. Cl.
CPC ......... *H01R 24/64* (2013.01); *G06F 13/4282* (2013.01); *H04L 41/0806* (2013.01); *H04L 41/0893* (2013.01); *H04L 69/16* (2013.01); *H05K 5/0204* (2013.01); *H05K 5/0247* (2013.01); *H05K 5/03* (2013.01); *H05K 7/1487* (2013.01); *H04L 41/24* (2013.01); *H04L 43/04* (2013.01)

(58) Field of Classification Search
CPC ...... G02B 6/4452; G02B 6/3897; H04Q 1/13; H04Q 1/136; H05K 7/1488; H05K 7/1492; H05K 7/1487; H05K 5/03; H05K 5/0204; H05K 5/0247; H01R 13/518; H01R 24/64
USPC ............. 361/679.4, 724, 729, 796, 807, 829
See application file for complete search history.

(56) References Cited

U.S. PATENT DOCUMENTS

| | | | |
|---|---|---|---|
| 7,077,710 B2 | 7/2006 | Haggay et al. | |
| 7,220,145 B2 | 5/2007 | Denovich et al. | |
| 2004/0229501 A1 | 11/2004 | Caveney et al. | |
| 2005/0065972 A1* | 3/2005 | Haines | ................ H04L 67/1097 |
| 2005/0201073 A1* | 9/2005 | Pincu | ....................... H04Q 1/02 |
| | | | 361/797 |

(Continued)

*Primary Examiner* — James Wu
(74) *Attorney, Agent, or Firm* — Horizon IP Pte Ltd.

(57) ABSTRACT

A communications device comprises at least eight first plate communication interfaces disposed along one length of one side of the housing. At least six second plate communication interfaces are disposed along the length of the second side of the housing, wherein the at least six second plate communication interfaces comprise at least six universal serial bus (USB) ports. At least one circuit board is disposed in the housing and electrically connected to the first and second plate communication interfaces.

12 Claims, 8 Drawing Sheets

(56) References Cited

U.S. PATENT DOCUMENTS

| | | | |
|---|---|---|---|
| 2006/0223343 A1* | 10/2006 | Campini | H05K 1/144 439/64 |
| 2007/0165618 A1 | 7/2007 | Niazi et al. | |
| 2009/0152216 A1 | 6/2009 | Champion et al. | |
| 2011/0078346 A1 | 3/2011 | O'Connor et al. | |
| 2011/0126275 A1* | 5/2011 | Anderson | H04L 9/3213 726/8 |
| 2012/0014384 A1 | 1/2012 | Diab et al. | |
| 2015/0317594 A1 | 11/2015 | Reznik et al. | |

* cited by examiner

HIGH DENSITY COMMUNICATIONS DEVICE

CROSS-REFERENCE TO RELATED APPLICATIONS

This application is a continuation of prior application Ser. No. 15/372,134, filed Dec. 7, 2016, which is a continuation of prior application Ser. No. 15/063,838, filed Mar. 8, 2016, which claims the benefit of U.S. Provisional Application No. 62/130,491, filed Mar. 9, 2015, entitled "High Serial Port Count Infrastructure Management Device," and U.S. Provisional Application No. 62/144,870, filed Apr. 8, 2015, entitled "High Serial Port Count Infrastructure Management Device," which are all hereby incorporated by reference in their entirety.

BACKGROUND

In data centers, the concentration of Information Technology ("IT") devices (e.g. virtual instantiated in combination with physical computing hardware and software in combination with physical devices such as: compute nodes, networking nodes, storage nodes, power nodes, and/or cooling nodes) may create a data center environment with significant overhead in tracking, configuring, clustering and managing IT device state(s). Some of the various techniques to work in such a cluttered environment may require a combination of device search tools, multiple IT device concentrator hardware units, management tools and/or many more additional supporting tools.

Additionally, various IT devices, such as IT devices by various vendors, may have different communication interfaces, network protocols, user interfaces and APIs, which may increase the difficulty of communicating with IT device(s).

When information about the IT device(s) is known, action(s) may be required over the IT device(s) distributed on a cluster of IT devices in order to enforce compliance and/or security needs on the data center.

DETAILED DESCRIPTION

Figure 1:
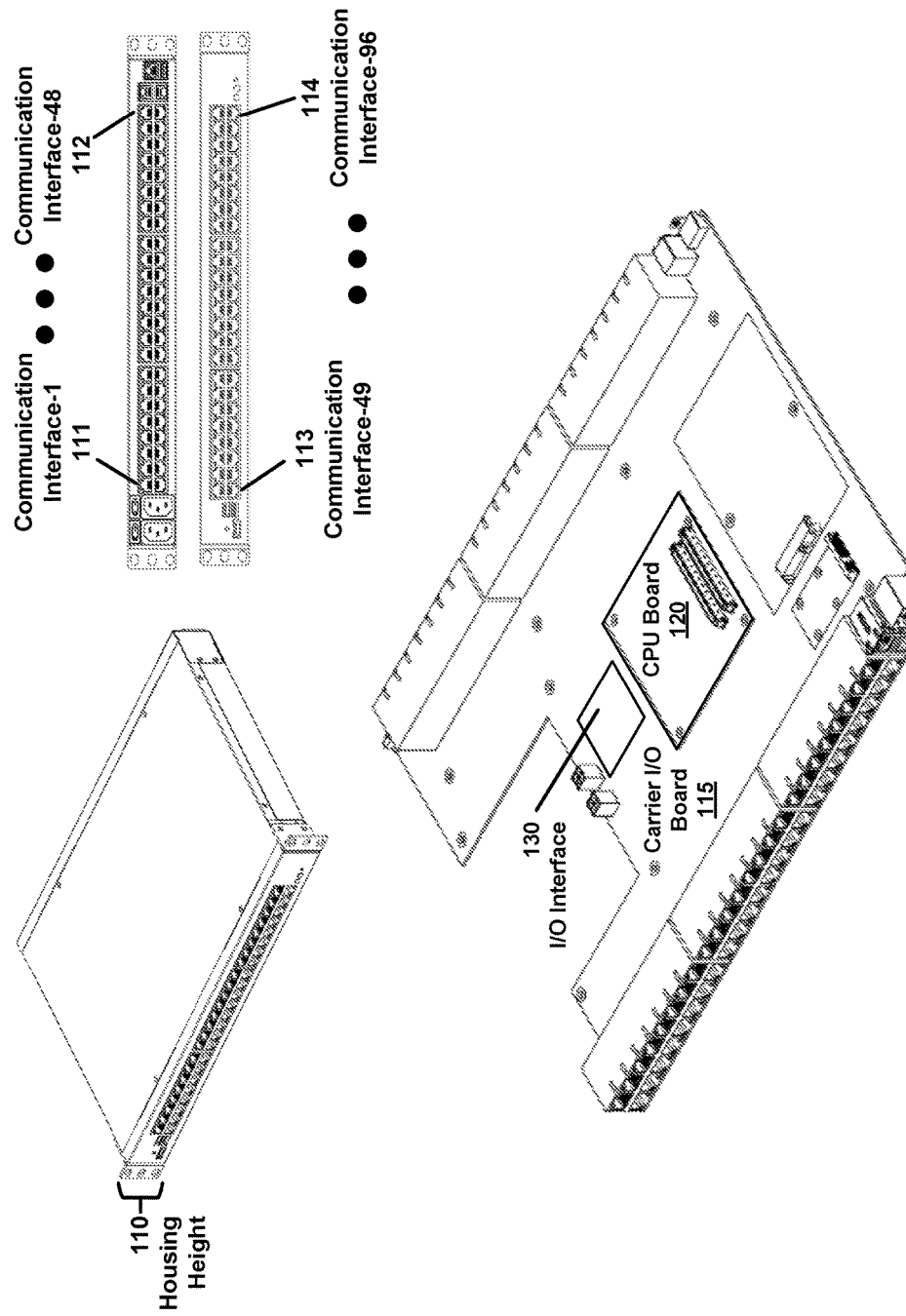
FIG. 1 is an example of a housing with 96 communication interfaces according to some of the various embodiments of the present invention.

Some of the various embodiments of the present invention relate to infrastructure management systems, and more particularly to a data center infrastructure management device(s) configured to process network communication of data center component(s). Various embodiments relate to a data center infrastructure configured to process network communication from data center component(s) (e.g. IT devices) and employ the device information to determine an action to be performed on data center component(s) in an infrastructure management system.

A device is a machine and/or component that may attach to a computer and/or computer network. Examples of devices include disk drives, printers, displays, mice, and modems. These particular devices may fall into a category of peripheral devices separate from a main computing device. Other example devices may be non-peripheral devices such as IT devices. Many devices, whether peripheral or not, may employ a program called a device driver that may act as a translator, converting general commands from an application into specific commands that the device understands.

An IT device is an "Information Technology" device related to computing technology, comprising, but not limited to: data center devices, networking devices, hardware devices, software operating in combination with a hardware IT device, Internet devices, and/or the like. Some IT devices may employ virtual devices operating on specially configured hardware. Additional examples of IT devices include servers, compute nodes, routers, switches, firewalls, load balancers, networking nodes, storage nodes, power nodes, cooling nodes, storage appliances, power appliances, cooling appliances, network appliances, virtual appliances, virtual machines, system hardware with network access, hosted module within a system, combinations thereof, and/or the like.

A virtual device may employ a software virtual device driver operating on a hardware computing device configured to emulate hardware and/or other devices so that multiple applications may, for example, access hardware interrupt channels, hardware resources and memory without causing conflicts. Computer hardware may require communication and control processes for devices and/or hardware components to access each other in a controlled manner. These processes may be defined as device drivers, which may comprise code that an application may employ to access hardware and/or external software resources. Some example virtual devices may be configured for use in multitasking operating systems. In such an example, a device driver may be controlled by an operating system's virtual device driver manager and shared by applications running within that kernel. A virtual device driver may pass interrupt and memory requests through the kernel, which in turn may allocate resources as required.

An agent may comprise a computer program that acts for a user or other program in a relationship of agency, which derives from the Latin agere (to do): an agreement to act on one's behalf. Such "action on behalf of" implies the authority to decide which, if any, action is appropriate. Some agents may comprise, but are not limited to: intelligent agents (in particular exhibiting some aspect of artificial intelligence, such as learning and reasoning), autonomous agents (capable of modifying the way in which the agent achieves objectives), distributed agents (being executed on physically distinct computers), multi-agent systems (distributed agents that do not have the capabilities to achieve an objective alone and thus must communicate), mobile agents (agents that can relocate their execution onto different processors), and/or the like.

Some of the various embodiments may communicate with virtual (in combination with configured hardware) and/or physical IT devices such as compute nodes, networking nodes, storage nodes, power nodes, cooling nodes, other IT devices, combinations thereof, and/or the like. An infrastructure management system may automatically perform an action on IT device(s)—based at least in part, by an IT device information.

The nature of the interaction between infrastructure management system(s) and IT device(s) may be regulated by the type of device itself to dictate network protocols natively supported by the IT device(s). The type of IT device(s) may also be used to identify a class or type of action that may apply for IT device(s) available in a network.

Figure 8:
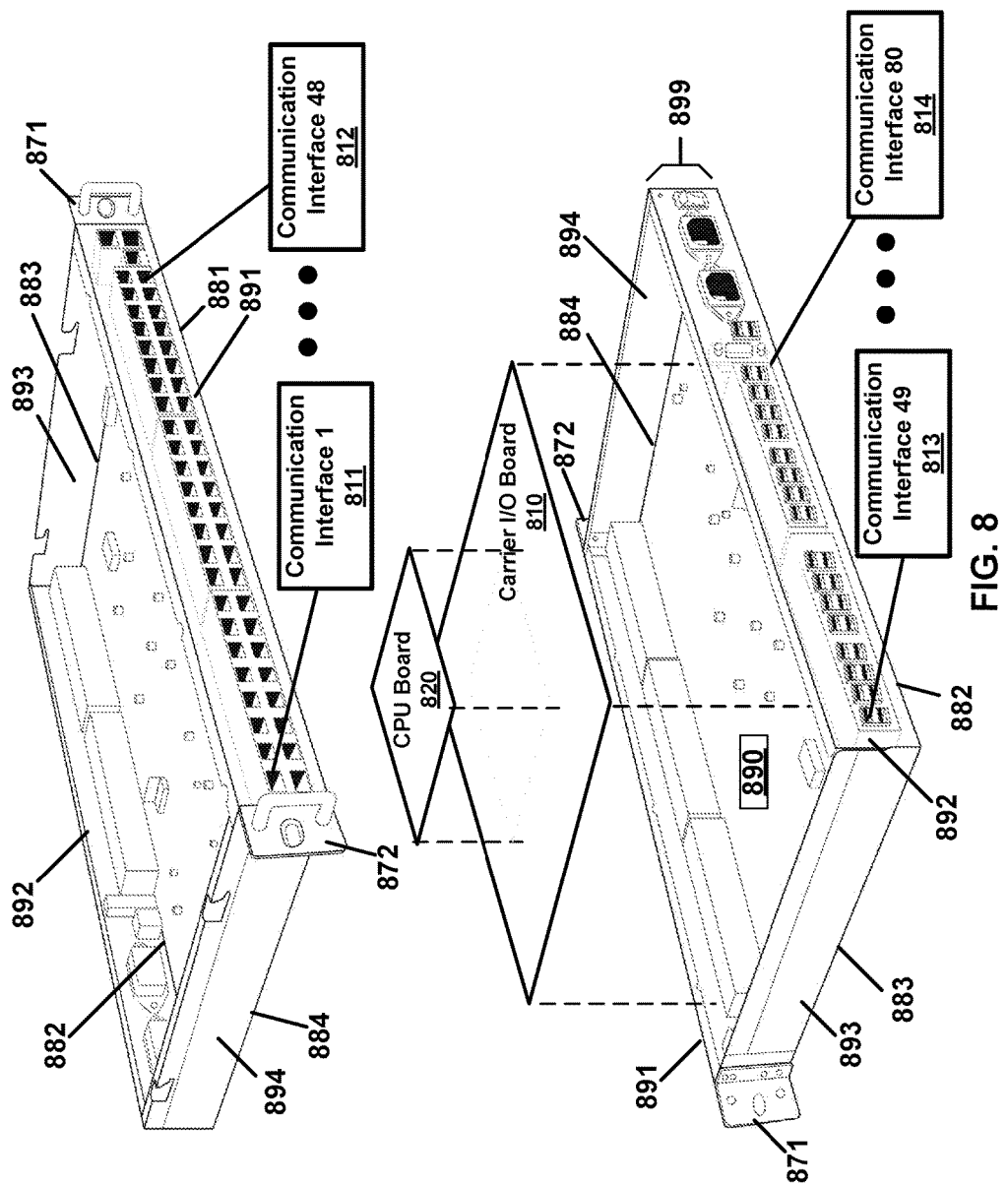
FIG. 8 is an example of a housing with 80 communication interfaces according to some of the various embodiments of the present invention.

FIG. 1 and FIG. 8 each illustrate an example housing with communication interfaces according to some of the various embodiments of the present invention. FIG. 8 illustrates an example housing with 80 communication interfaces. FIG. 1 illustrates an example housing with 96 communication interfaces. A housing may be employed, for example, by an infrastructure management device or other device with communication interfaces according to some of the various embodiments of the present invention. With reference to FIG. 1, the housing height 110 may comprise of a one Rack-Unit (1 U) height mounted horizontally to the rack, or a less than one Rack-Unit (<1 U) height mounted horizontally to the rack, or a zero Rack-Unit (0 U) height mounted vertically to the rack. The housing may be configured to enclose at least one communications interface, one or more processors and a non-transitory tangible machine readable medium. The communication interfaces (illustrated in this example embodiment as interface-1 111 to communication interface-48 112 and communication interface-49 113 to communication interface-96 114) may be distributed in any number on both sides of the infrastructure management device according to the space availability on the housing and where at least one communication interface may comprise at least 60 serial port interfaces. The communications interface 111, 112, 113, 114 may comprise at least one of the following: a serial port, an RS-232 serial, an RS-485 serial, a Local Area Network (LAN), a Wide Area Network Area (WAN), a Virtual Private Network (VPN), a Wi-Fi wireless Network, a USB port, Bluetooth™, a combination of the above and/or the like. The carrier I/O board 115 may be employed to hold the CPU board 120, the I/O interface 130, and additional peripheral controller(s) related to the I/O interface units. CPU board 120 may comprise processing unit(s), system memory and common peripherals. I/O interface 130 may be configured to perform a logical mapping between the I/O signals from the carrier I/O board 115 and the communication interface units 111, 112, 113 and 114. Examples of I/O signal logical mapping may comprise (but not limited to) at least some of the follow: a null-modem serial port, a DCE serial port, a DTE serial port, a Cisco pinout serial port, a Cyclades pinout serial port, a straight-through serial port, a cross-over serial port, a rolled RJ45 port, an RS-232 serial port, an RS-485 serial port, a Local Area Network (LAN), a Wide Area Network Area (WAN), a Virtual Private Network (VPN), a Wi-Fi wireless Network, an USB port, Bluetooth™, a combination of the above and/or the like.

With reference to FIG. 8, the housing height may comprise of a one Rack-Unit (1 U) height mounted horizontally to the rack, or a less than one Rack-Unit (<1 U) height mounted horizontally to the rack, or a zero Rack-Unit (0 U) height mounted vertically to the rack. The housing may be configured to enclose, for example, a carrier I/O boards 810, a CPU board 820, and communications interfaces (for example: 811 . . . 812 and 813 . . . 814) facing opposite sides of the housing respectively. The communication interfaces (illustrated in this example embodiment as RJ45 interface-1 811 to RJ45 communication interface-48 812 and USB communication interface-49 813 to USB communication interface-80 814) may be distributed in various quantities on both sides of the housing and where at least one communication interface may comprise, for example, at least 60 serial port interfaces. The communications interfaces 811, 812, 813, 814 may comprise at least one of the following: a serial port, an RS-232 serial, an RS-485 serial, a Local Area Network (LAN), a Wide Area Network Area (WAN), a Virtual Private Network (VPN), a Wi-Fi wireless Network, a USB port, Bluetooth™, an RJ45 port, a combination of the above and/or the like. The carrier I/O board 815 may be employed to hold the CPU board 820, an I/O interface, and additional peripheral controller(s) related to the I/O interface units. CPU board 820 may comprise processing unit(s), system memory and common peripherals. The board(s) may be configured to perform a logical mapping between the communication interface connectors (for example 811 . . . 812, and 813 . . . 814. Examples of I/O signal logical mapping may comprise (but not limited to) at least some of the follow: a null-modem serial port, a DCE serial port, a DTE serial port, a Cisco pinout serial port, a Cyclades pinout serial port, a straight-through serial port, a cross-over serial port, an RJ45 port, an RS-232 serial port, an RS-485 serial port, a Local Area Network (LAN), a Wide Area Network Area (WAN), a Virtual Private Network (VPN), a Wi-Fi wireless Network, an USB port, Bluetooth™, a combination of the above and/or the like.

Figure 2:
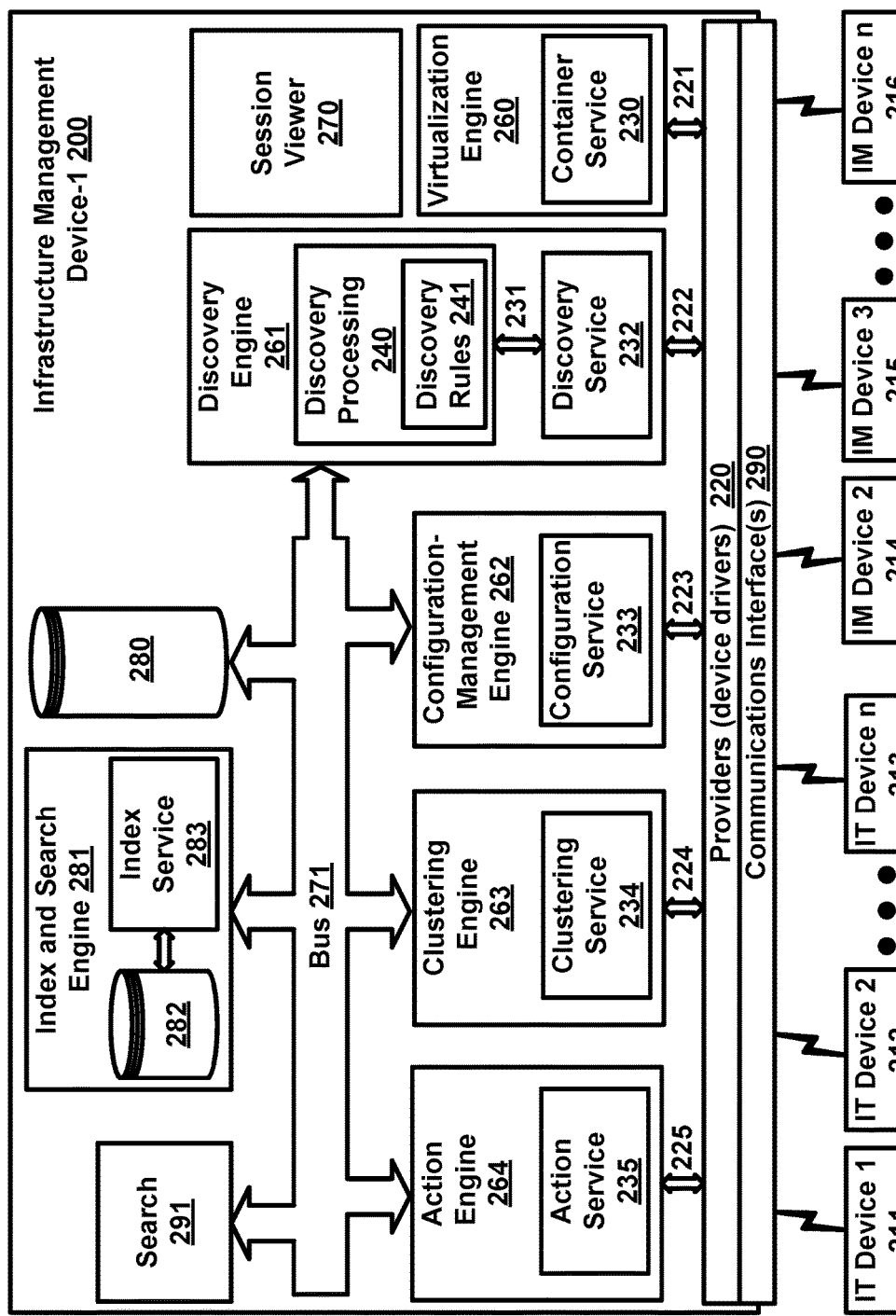
FIG. 2 is an example block diagram of an infrastructure management device showing example components that may be involved in a device communication over the communications interface where the infrastructure management may configure, discover, cluster, index, exchange index table, search or take action on at least one IT device in a data center according to some aspects of various embodiments of the present invention.

FIG. 2 is an example block diagram of an infrastructure management device according to some aspects of various embodiments. FIG. 2 illustrates example components that may be involved in device communication over communications interface(s) where the infrastructure management may configure, discover, cluster, index, exchange index table, search and/or take action on at least one IT device in a data center. The infrastructure management device-1 200 may interact with IT devices 211, 212 . . . 213 and/or with other IM (Infrastructure Management) devices 214, 215 . . . 216 via communication interfaces 290. The infrastructure management devices 200, 214, 215 . . . 216 may comprise a housing, at least 60 serial port interfaces, and at least one of the following: system hardware with network access, a server, a compute node, a router, a switch, a firewall, a load balancer, a networking node, a storage node, a power node, a network appliance, a virtual appliance, a hosted module within a system, a combination thereof, and/or the like. The IT devices 211, 212 . . . 213 may comprise, for example, a server, a compute node, a router, a switch, a firewall, a load balancer, a networking node, a storage node, a power node, a cooling node, a storage appliance, a power appliance, a cooling appliance, a network appliance, a virtual appliance, a virtual machine, system hardware with network access, a hosted module within a system, a combination thereof, and/or the like. Providers 220 may comprise modules configured to understand the communication protocols capabilities of the IT devices 211, 212 . . . 213 and/or IM devices 214, 215 . . . 216 and may employ these capabilities to interact with such devices via the communications interface(s) 290. The providers 220 may also interact with virtualization engine 260, discovery engine 261, configuration/management engine 262, clustering engine 263 and/or action engine 264 on the infrastructure management device-1 200. Providers 220 and engine modules 260, 261, 262, 263 and/or 264 may interact via provider interface(s) 221, 222, 223, 224 and/or 225 respectively.

A first plate 891 may be disposed along the first edge 881 with a height less than or equal to a housing height 899. A second plate 892 may be disposed along the second edge 882 with a height less than or equal to the housing height 899. A third plate 893 may be disposed along the third edge 883 with a height less than or equal to the housing height 899. A fourth plate 894 may be disposed along the fourth edge 884 with a height less than or equal to the housing height 899. The brackets 871 and 872 may be employed to horizontally mounting the housing to a rack. Brackets 871 and 872 may also be employed to vertically mount the housing to a rack.

Configuration/management engine 262 may provide an interface to configure and/or manage infrastructure management device-1 200 via configuration service 233. The interface may comprise a user interface which may be available via, for example, a command line interface (CLI), a web interface, programmatically via an application programmable interface (API), a combination thereof, and/or the like. The configuration may comprise at least one of the following: IT device information, discovery enablement information, clustering enablement information, a combination thereof, and/or the like. The IT device information may comprise at least one of the following: a universally unique identifier, a virtual machine name, a hypervisor IP address, an alias IP address, a group/community identifier, a port identifier, a port range identifier, a serial port range, a serial port identifier, a serial port name, an IT device name, a power status, an action, a list of actions, a command, a hostname, an icon, an internet protocol Address, a protocol type, a service processor type, a media access control address (MAC) Address, a hierarchical organization, a connection status, a configuration parameter, a user defined field and value, a map address location, a group IT device parameters, a group of users' parameters, an IT device access rights parameter, a notification parameter, a data logging parameter, an alert parameters, an IT device initial status, a combination thereof, and/or the like. The discovery enablement information may comprise at least one of the following: a configuration parameter, a multitude of parameters, an action, a multitude of actions, and an IT device state. The clustering enablement information device may comprise at least one of the following: a configuration parameter, a multitude of parameters, an action, a multitude of actions, an IT device state, a combination thereof, and/or the like. The configuration-management engine 262 may be connected, for example, via bus 271 to a non-volatile memory 280 in order to store, read or update the configuration information required by the system. The non-volatile memory 280 may comprise at least one of the following: an in-memory data store, an on-disk data store, a local data store, a remote data store, a distributed data store, a replicated data store, a combination of the above, a combination thereof, and/or the like.

Continuing on example FIG. 2 and according to some of the various embodiments, discovery engine 261 may be employed for discovering of IT devices which may be interconnected via communication interface 290. IT devices 211, 212 . . . 213 may request connection and/or configuration via communication interface 290 once they are powered on and/or from time to time (e.g. a periodic basis). The identification of the IT devices 211, 212, 213 may be collected by the discovery service 232. Alternatively, discovery service 232 may also discover the IT device identification by polling for information from time to time (e.g. on a periodic basis). In this example scenario, polled IT device(s) may also comprise a concentrator of additional child IT device(s) and the information collected from the polled IT device(s) may contain a collection of IT device information identification from the children IT device(s). This mechanism may provide a bulk discovery process. For example (but not limited to), console server IT devices from multiple vendors may provide information on IT device(s) connected via their serial ports. Similarly, a virtual machine hypervisor may provide information on virtual machines running on that system. Examples of IT device identification may comprise, but are not limited to: universally unique identifier (UUID), VM name, group/community information, IP address, media access control address (MAC address), hostname, serial port range, combinations thereof, and/or the like. IT device identification may be sent via 231 to discovery processing 240 and may be evaluated by discovery processing 240 against discovery rules 241 in the system. Discovery rules 241 may employ a combination of logic of parameters, such as, for example, AND/OR logic. Matching criteria may be based on partial parameters and/or full parameters inspected against the IT device identification. A discovery action, (such as, but not limited to an update of existing IT device, add new IT device, a combination thereof, and/or the like) may be taken in combination with, for example, upon a successful match between one or more of the discovery rules 241 and IT device identification. Examples of discovery actions sent via bus 271 to a non-volatile memory 280 may comprise, but are not limited to: clone configuration from an existing device, update configuration if an IT device already exists and if changes are required, deny clone, (which means no response may be given to the IT device from the system—this allows supporting multiple discovery systems in the same network), a combination thereof, and/or the like. A discovery action may also get information from a non-volatile memory 280 via bus 271 in order to perform a discovery service 232. Additionally, non-volatile memory 280 may hold, for example, IT device data for a newly added IT device, changes or updates on existing IT device(s), information on existing IT device(s) that may be used on cloning process or discovery process, combinations thereof, and/or the like.

Continuing on FIG. 2 and according to some of the various embodiments, index and search engine 281 may employ index service 283 to index IT device information that may be retrieved from non-volatile memory 280 via bus 271 and store the indexing into non-volatile IT device index 282. Index service 283 indexing may comprise: collecting at least one IT device information for at least one of at least one IT device from the infrastructure management device, processing at least one IT device information for at least one of at least one IT device from the infrastructure management device, organizing at least one IT device information for at least one of at least one IT device from the infrastructure management device, updating the IT device index of the infrastructure management device, a combination thereof, and/or the like. The IT device index 282 may comprise at least one of the following: an in-memory data store, an on-disk data store, a local data store, a remote data store, a distributed data store, a replicated data store, a combination of the above, and/or the like.

Continuing on FIG. 2 and according to some of the various embodiments, clustering engine 263 may employ clustering service 234 to cluster the infrastructure management device-1 200 with at least one other infrastructure management device 214, 215 . . . 216 when enabled by the clustering enablement information. The clustering service 234 may comprise (but not limited), at least one of the following: configuring one of the clustered infrastructure management devices to name and maintain a list of a multitude of infrastructure manager devices communicatively connected, configuring one of the clustered infrastructure management devices to define at least one credential for a multitude of infrastructure manager devices communicatively connected on at least one named list, configuring one of the clustered infrastructure management devices to define at least one SSL (Secure Socket Layer) certificate for the clustered infrastructure management devices communicatively connected on at least one named list, configuring one of the clustered infrastructure management devices to request a list of the clustered infrastructure management devices communicatively connected on at least one named list, configuring one of the clustered infrastructure management devices to interact to at least one of the clustered infrastructure management devices communicatively connected on at least one named list, providing at least one IT device information of the clustered infrastructure management devices communicatively connected on at least one named list, exchanging at least one IT device index 282 of the clustered infrastructure management devices communicatively connected on at least one named list, a combination thereof, and/or the like Continuing on FIG. 2 and according to some of the various embodiments, search module 291 may search IT device index 282 information via bus 271 for a list of IT device information based on criteria applied to IT device index. The searching may further comprise conducting a natural language search with at least one of the following: a tabular representation of the search result, a Web representation of the search results, an organizational tree representation of the search results, a graphical node representation of the search results, a geographic map representation of the search results, a command-line (CLI) representation of the search results, a combination thereof, and/or the like. The criteria may comprise at least one of the following: a query parameter, a source document index, a source field, a number of matching results to return, a sorting order, a Boolean logic, a filter, a range, a logical condition, an aggregation, a relevance, a combination of the above, and/or the like.

Continuing on FIG. 2 and according to some of the various embodiments, the action engine 264 may employ the action service 235 to perform at least one the following: executing at least one user defined command on at least one of the at least one IT device over at least one of the at least one communications interface, executing at least one user defined script on at least one of the at least one IT device over at least one of the at least one communications interface, executing at least one user defined program on at least one of the at least one IT device over at least one of the at least one communications interface, executing at least one user defined command on at least one of the at least one IT device locally, executing at least one user defined script on at least one of the at least one IT device locally, executing at least one user defined program on at least one of the at least one IT device locally, executing at least one user defined command on at least one of the at least one other infrastructure management device over the network, executing at least one user defined script on at least one of the at least one other infrastructure management device over the network, executing at least one user defined program on at least one of the at least one other infrastructure management device over the network, executing at least one user defined command on the infrastructure management device locally, executing at least one user defined script the infrastructure management device locally, executing at least one user defined program on the at least one infrastructure management device locally, performing a serial console connection over at least one of the at least one communications interface, performing a serial virtual machine console connection over at least one of the at least one communications interface, performing a SOL (Serial-Over-Lan) console connection over at least one of the at least one communications interface, performing a KVM (Keyboard-Video-Mouse) console connection over at least one of the at least one communications interface, performing a MKS (Mouse-Keyboard-Screen) virtual machine console connection over at least one of the at least one communications interface, performing a power command on at least one of the at least one IT device over at least one of the at least one communications interface, establishing a TCI/IP tunnel between the user's workstation and the infrastructure management device, performing access rights control on commands, performing data log collection on an IT device data session, performing alert and notification based on configuration and data log collection from at least one of the at least one IT device, performing authentication and authorization to a user based on at least on one of the following: command, user group and IT device, a combination thereof, and/or the like.

With respect to an action performed by action service 235, for example, a pre-defined command like "power off" may be executed as part of a set of actions taken by a system administrator accessing an infrastructure management device in response to an IT device search result based on a search criteria applied across the IT device index 282. Since the IT device index 282 from single clustered infrastructure management device(s) may have been previously exchanged by the clustering service 234, the search may be performed over a local copy of the IT device index 282 and cover multiple clustered infrastructure management devices. Providers 220 and communication interface(s) 290 may provide a means to communicate with the IT device in order to carry out the execution of the command "power off" on the IT device regardless of the IT device type enrolled in the infrastructure management device. In another example, the IT device may report a firmware version state like "firmware version 1.2," which may require a complex set of actions performed by a user defined command such as "firmware upgrade" implemented via a custom script residing on one or more of the IT device(s) in the network. The custom script may make use of abstraction provided by provider(s) 220 and communication interface(s) 290 in order to carry out multiple actions such as, for example, upgrading firmware on the IT device follow by a "power reboot."

Continuing on FIG. 2 and according to some of the various embodiments, the virtualization engine 260 may employ container service 230 which may host, configure and managed virtualized process(es) and environment(s) on the infrastructure management device. Example of virtualized process(es) and environment(s) may comprise, but are not limited to: dockerized applications, docker hypervisor, docker containers, virtual machine hypervisors, kernel-based virtual machines, virtual applications, virtual machines, virtual appliances, storage hypervisors, platform virtualization software, data mining applications, data collector applications, dash board applications, report applications, combinations thereof, and/or the like. For example, a standard dockerized splunk application could be hosted, configured, managed and executed by virtualized engine 260 and may crunch data available on the infrastructure management device in order to provide visualization of information.

Also illustrated on FIG. 2 and according to some of the various embodiments, session viewer 270 may provide a proxy viewer (e.g. an HTML5 proxy viewer) of the native user interface of at least one of the IT devices 211, 212, 213 connected to infrastructure management device-1 200. This process may provide a means to interact with an IT device UI (User Interface), without requiring additional application(s) be installed at end user workstation(s) and/or without requiring direct communication between an end user's workstation and an IT device. For example, an HTML5 proxy for a native user interface may include: a console viewer, remote console viewer, a remote SSH (Secure Shell) viewer, a TELNET view, a KVM (Keyboard-Video-Mouse) viewer, a virtual KVM (Keyboard-Video-Mouse) viewer, an MKS (Mouse-Keyboard-Screen) viewer, a virtual MKS (Mouse-Keyboard-Screen) viewer, a RDP (Remote-Desktop-Protocol) viewer, an VNC (Virtual-Network-Computing) viewer, a WEB viewer, combinations thereof, and/or the like. According to an additional example, a user accessing the infrastructure management device-1 200 may launch an MKS viewer to an IT Device that actually is a virtual machine running on a VMware EXSi server, without requiring direct network access to the virtual machine itself. When the MKS viewer is requested by the user, the infrastructure management device-1 200 may start an authorized and authenticated session with the virtual machine using a VMware application installed directly on the infrastructure management device-1 200 and the MKS viewer may forward the mouse, keyboard and screen interactions to an HTML 5 javascript running on a user's workstation browser. In this example, no application may be installed on the user's workstation and the HTML 5 javascript may be rendered directly from the infrastructure management device to the user's browser offering the same user experience on different browser applications, workstations, mobile devices, combinations thereof, and/or the like.

Figure 3:
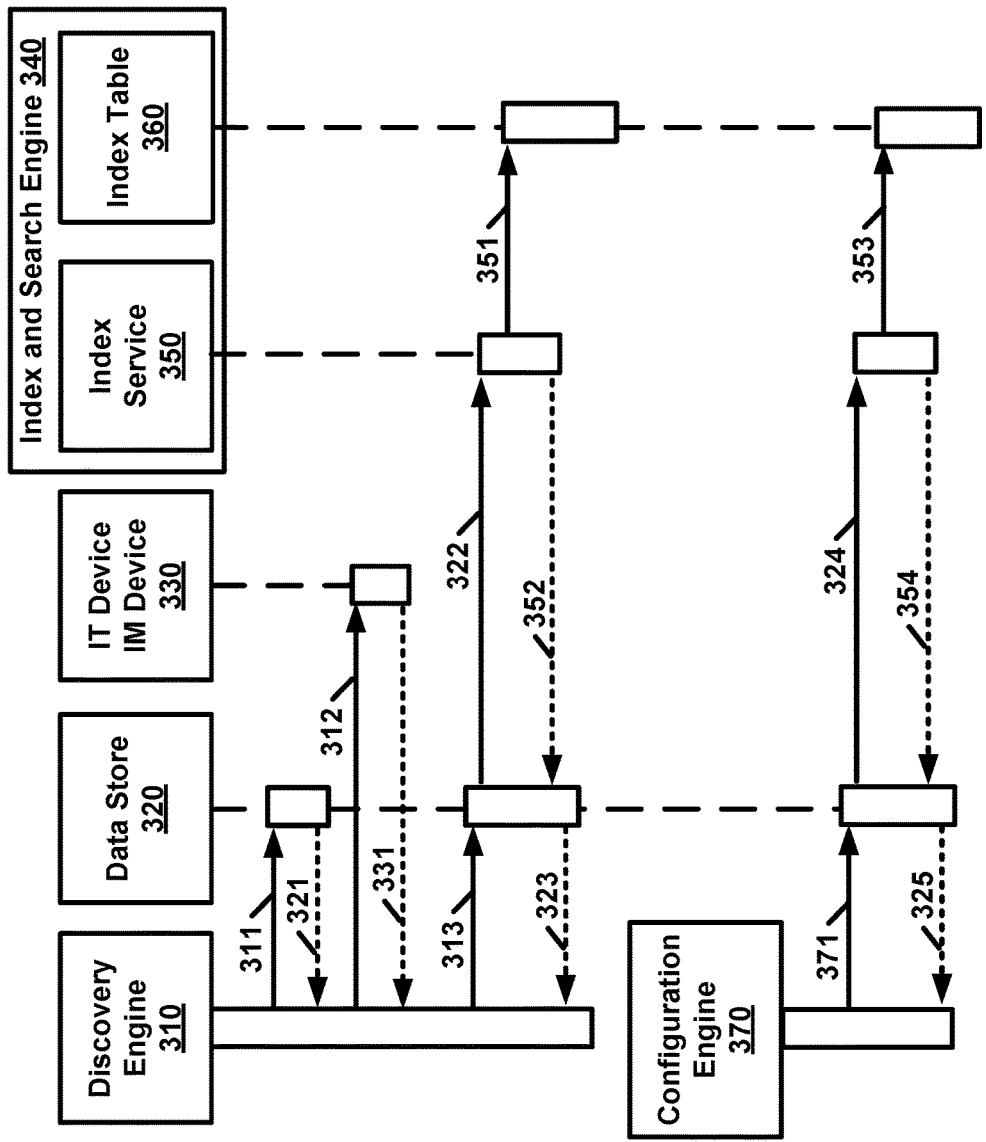
FIG. 3 is an example flow diagram illustrating one of the various techniques for the discovering and/or configuring of an IT device communicating with the infrastructure management system according to some of the various embodiments of the present invention.

FIG. 3 is an example flow diagram illustrating one of the various techniques for the discovering and/or configuring an IT device communicating with the infrastructure management system according to some of the various embodiments of the present invention. The discovery engine 310 may request, via 311, configuration information from a non-volatile data store 320. A typical response may comprise information about the discovery rules and discovery service, which may be provided by the data store 320 to the discovery engine 310 via 321. Discovery engine 310 may employ this information to initiate an interaction with IT device/IM device 330 via 312. Discovery engine 310 may also wait for an interaction initiated by the IT device/IM device 330 via 331. Discovery engine 310 may discover a new IT device/IM device 330 and/or may discover a new information about an existing IT device/IM device 330. The new device and/or the information update may be sent to data store 320 via 313 and the data store may reply with a notification status via 323. The communication via 313 may be executed in bulk and/or batch. The information entered into data store 320 may trigger via 322, a call to index service 350 inside index and search engine 340, which may cause an update via 351 to the index table 360. Once the information has being processed by the index service 350, it may send a notification status via 352 to data store 320.

In another independent flow at FIG. 3 and according to some of the various embodiments, configuration engine 370 may send, via 371, configuration information to data store 320 and the data store may reply with a notification status via 325. The communication via 371 may be executed in bulk and/or batch. The information entered into data store 320 may trigger, via 324, a call to index service 350 inside index and search engine 340, which may cause an update via 353 to the index table 360. Once information has been processed by the index service 350, the index service 350 may send a notification status via 354 to data store 320.

Figure 4:
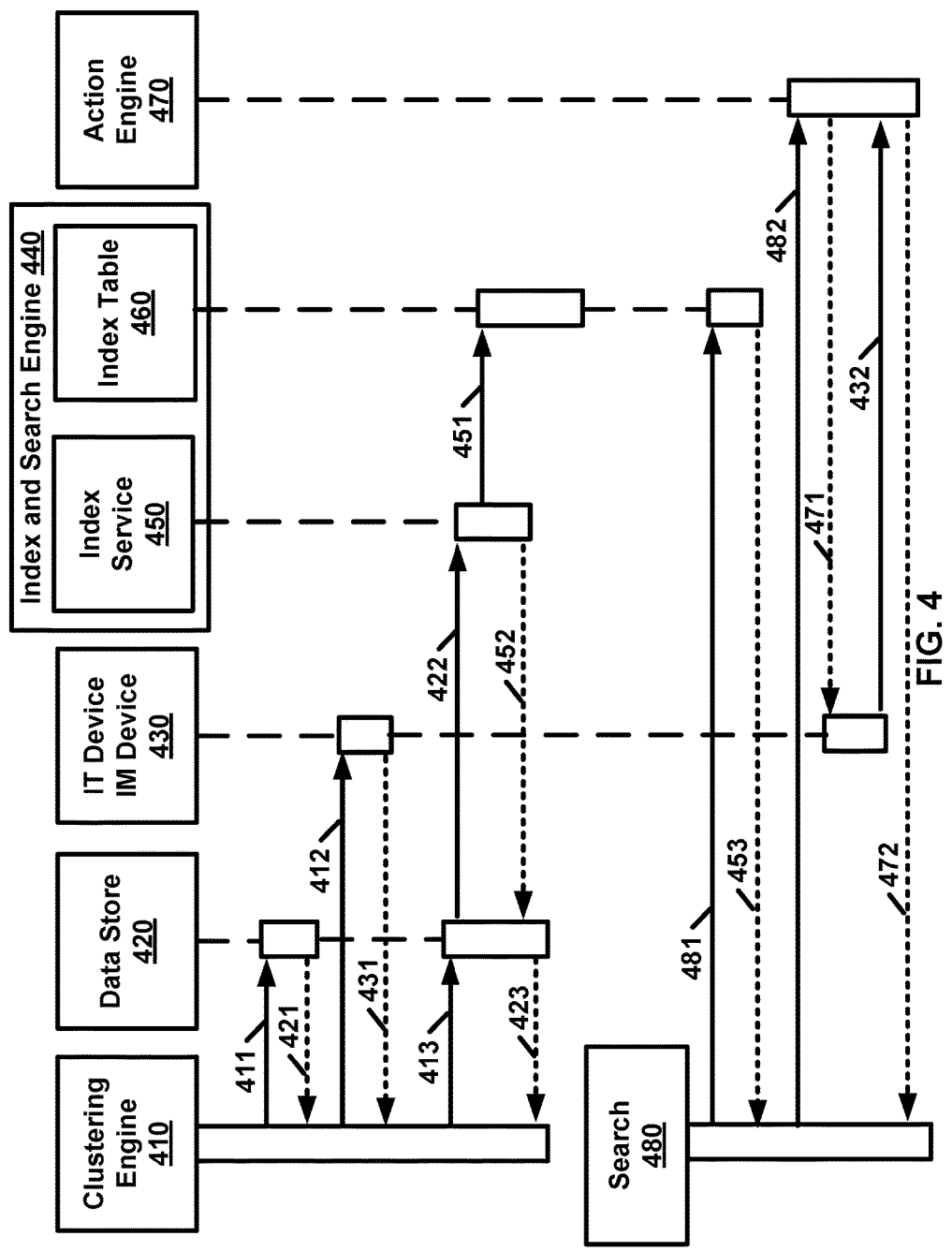
FIG. 4 is an example flow diagram illustrating one of the various techniques for the clustering and/or searching of an IT device communicating with the infrastructure management system according to some of the various embodiments of the present invention.

FIG. 4 is an additional example flow diagram illustrating one of the various techniques for the clustering and/or searching of an IT device communicating with the infrastructure management system according to some of the various embodiments of the present invention. Clustering engine 410 may request, via 411, configuration information from a non-volatile data store 420. A typical response may comprise information about this and other infrastructure management devices which may be configured to connect to the common secured cluster community via a communications interface. The configuration information may be provided by data store 420 to clustering engine 410 via 421. The clustering engine 410 may employ this information via 412 to initiate a new connection and/or keep a periodic interaction with at least one infrastructure management device at IT device/IM device 430. Response 431 may be employed to track the status and/or information of the clustering connection. This status/information of the clustering connection may be sent, via 413, to data store 420 and may be stored for future reference. The data store 420 may reply with a notification status via 423. The information entered into data store 420 may trigger, via 422, a call to index service 450 inside index and search engine 440, which may cause an update, via 451, to index table 460. Once information has been processed by index service 450, index service 450 may send a notification status, via 452, to data store 420. Alternatively, clustering engine 410 may share its local IT device index information, via 412, with other infrastructure management devices at IT Device/IM Device 430 that may be part of the clustering connection. Other infrastructure management devices may send their individual IT device index information, via 431, so that each infrastructure management device may have IT device index information of each other available locally.

In another independent flow at FIG. 4 and according to some of the various embodiments, search 480 may send search requests 481, which may use natural language search queries and/or other query formats and criteria, to index table 460 inside index and search engine 440. The search queries may be performed over locally available IT device index table 460. Search result 453 may be provided to search 480. Search 480 may employ the search result to request one or multiple actions 482 to action engine 470. The action commands 471 may be performed over IT devices/IM devices 430 and their action results 432 may be sent to action engine 470. The action engine 470 may also report action results 472 back to search 480.

Figure 5:
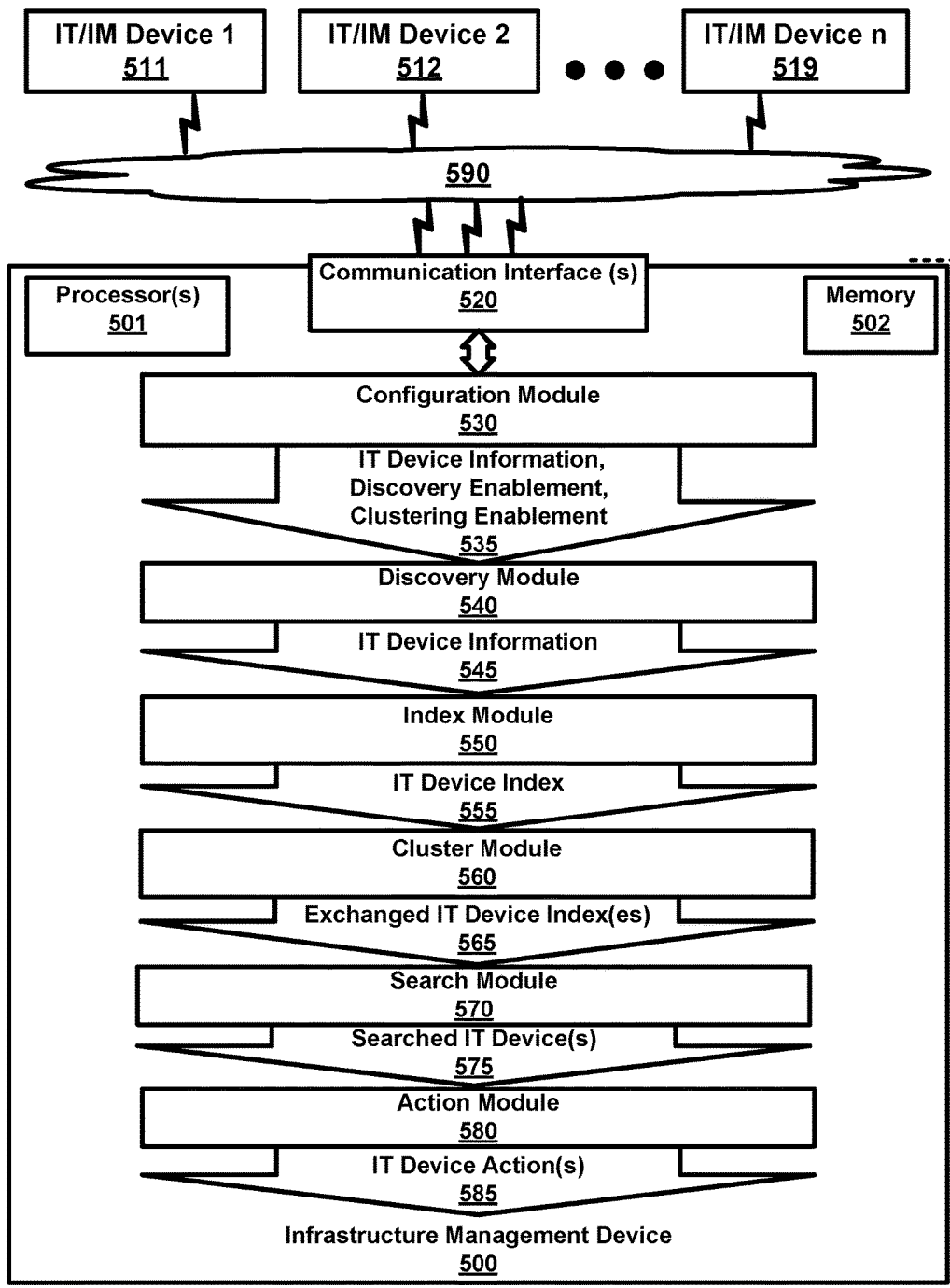
FIG. 5 is an example block diagram of an infrastructure management device according to some aspects of various embodiments of the present invention.
Figure 6:
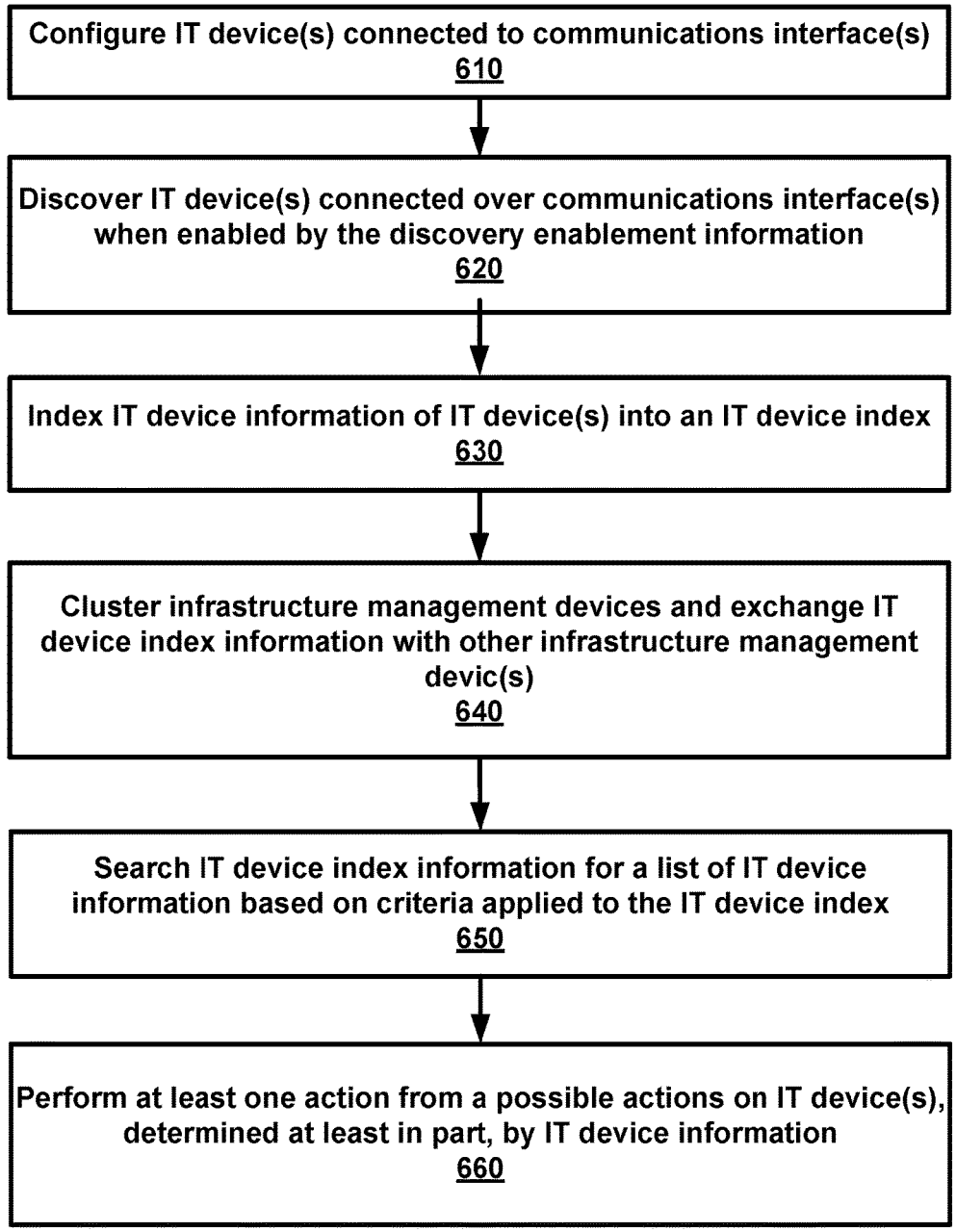
FIG. 6 is an example flow diagram of configuring, discovering, indexing, clustering, and/or taking action(s) according to some aspects of various embodiments of the present invention.

FIG. 5 is an example block diagram of an infrastructure management device according to some aspects of various embodiments of the present invention. FIG. 6 is an example flow diagram of configuring, discovering, indexing, clustering, and/or taking action(s) according to some aspects of various embodiments of the present invention.

Some of the various embodiments may comprise an infrastructure management device 500. The infrastructure management device 500 may comprise at least one processor 501, memory 502, communication interface(s) 520 and other supporting hardware (e.g. electronic communications busses, controllers, non-transitory tangible machine readable medium readers, combinations thereof, and/or the like). Memory 502 may comprise a non-transitory tangible machine readable medium. The non-transitory tangible machine readable medium may comprise instructions configured to cause at least one processor 501 of the one or more processors to perform a process of configuring, discovering when enabled by the discovery enablement information, indexing IT device information into an IT device index, clustering the infrastructure management device when enabled by the clustering enablement information, exchanging IT device index information with other infrastructure management devices being clustered, searching IT device index information for a list of IT device information based on criteria and performing an action on IT device(s), determined at least in part, by IT device information. The communication interface(s) 520 may be configured to communicate with a multitude of IT devices/IM devices (511, 512 . . . 519) over a network 590. The communications interfaces (520) may comprise, but not limited to, at least one of the following: at least 60 serial port interfaces, an RS-232 serial port, an RS-485 serial port, a Local Area Network (LAN), a Wide Area Network Area (WAN), a Virtual Private Network (VPN), a Wi-Fi wireless Network, an USB port, Bluetooth™, a combination of the above, and/or the like. The communication interface(s) 520 may further comprise a housing which may comprise at least one of the following: a one Rack-Unit (1 U) height mounted horizontally to the rack, a less than one Rack-Unit (<1 U) height mounted horizontally to the rack, and zero Rack-Unit (0 U) height mounted vertically to the rack, and/or the like. The network 590 may comprise, but is not limited to: the Internet, an intranet, a connection to the Internet, a private cloud, interconnected data centers, a multi-nodal network, two or more computing devices connected using a Virtual Private Network (VPN), an on-premise network, an RS-232 serial network, an RS-485 serial network, a local area network (LAN), a wide area network Area (WAN), a Wi-Fi wireless network, an USB port, a Bluetooth™, a combination thereof, and/or the like. The infrastructure management device 500 may comprise a multitude of infrastructure management devices 500 configured to cooperatively operate together. Examples of an infrastructure management device 500 may comprise, but are not limited to: a housing, at least 60 serial port interfaces, and at least one of the following: a system hardware with network access, a server, a compute node, a router, a switch, a firewall, a load balancer, a networking node, a storage node, a power node, a network appliance, a virtual appliance, a hosted module within a system, a combination thereof, and/or the like. According to some of the various embodiments, IT device(s) (511, 512 . . . 519) may comprise at least one of the following: a server, a compute node, a router, a switch, a firewall, a load balancer, a networking node, a storage node, a power node, a cooling node, a storage appliance, a power appliance, a cooling appliance, a network appliance, a virtual appliance, a virtual machine, system hardware with network access, a hosted module within a system, a combination thereof, and/or the like.

IT device(s) (511, 512 . . . 519) communicatively connected over communication interface(s) 520 may be configured at block 610. This configuration may be performed by, for example, a configuration module 530. The configuration may configure the IT device information, the discovery enablement, and clustering enablement 535. The configuration of IT device(s) information may be performed in numerous ways according to various embodiments. For example, an IT device information may be configured by making changes to a universally unique identifier, a virtual machine name, a hypervisor IP address, an alias IP address, a group or community identifier, a port identifier, a port range identifier, a serial port range, a serial port identifier, a serial port name, an IT device name, a power status, an action, a list of actions, a command, a hostname, an icon, an internet protocol address, a protocol type, a service processor type, a media access control address (MAC), a hierarchical organization, a connection status, a configuration parameter, a user defined field and value, a map address location, a group IT device parameters, a group of users' parameters, an IT device access rights parameter, a notification parameter, a data logging parameter, an alert parameters, an IT device initial status, a combination of the above, and/or the like. In a second example, a discovery enablement information may be configured by making changes to a configuration parameter, a multitude of parameters, an action, a multitude of actions, an IT device state, a combination of the above, and/or the like. In a third example, a clustering enablement information may be configured by making changes to a configuration parameter, a multitude of parameters, an action, a multitude of actions, an IT device state, a combination of the above, and/or the like.

IT device(s) (511,512 . . . 519) communicatively connected over communication interface(s) 520 may be discovered at block 620 when enabled by the discovery enablement information. This discovery may be performed by, for example, a discovery module 540. Discovering may define classes of communication methods, protocols and process used to discover the IT device information 545 of IT devices connected over a communication interface. Discovering may also, according to some of the various embodiments, be employed to identify possible mechanisms to interact back with IT device(s). Discovering may comprise determining if another of the multitude of IT devices (511, 512 . . . 519) operates using a similar protocol. A protocol may comprise a system of digital rules for the exchange of data within or between computers. The rules may define format(s) for exchanging messages where some messages are configured to elicit a response from a range of possible responses pre-determined for that particular situation. A protocol may define the syntax, semantics, and synchronization of communication. Some specified behaviors may be independent of how an interface is implemented. A protocol may be implemented as hardware, software, or both. Some of the various communications protocols may be implemented according to one or more technical standards from organizations such as, but not limited to, the International Organization for Standardization (ISO), the International Telecommunications Union (ITU), the Institute of Electrical and Electronics Engineers (IEEE), and the Internet Engineering Task Force (IETF).

Discovering, according to some of the various embodiments, may further comprise determining if another of the multitude of IT devices (511, 512 . . . 519) operates using a similar communication profile. Yet other discovering may comprise determining if another of the multitude of IT devices are the same class of IT device. Additionally, for example, IT device information may be discovered by interacting with at least one IT device connected to the serial port interface, listening to a communication from the at least one IT device, listening to an DHCP request from the at least one IT device, interacting with a communications processor associated with at least one IT device, interacting with a communications processor disposed within at least one IT device, interacting with a virtual machine hypervisor, interacting with a console server, interacting with a terminal server, interacting with an agent, interacting with a Configuration Management Database system, interacting with a data store system, interacting with another infrastructure management device, a combination of the above, and/or the like.

IT device information of IT devices may be indexed into an IT device index at block 630. This indexing may be performed by, for example, an index module 550. The indexing of IT device information may be performed in numerous ways according to various embodiments. For example, indexing may be performed by collecting at least one IT device information for at least one of at least one IT device from the infrastructure management device, processing at least one IT device information for at least one of at least one IT device from the infrastructure management device, organizing at least one IT device information for at least one of at least one IT device from the infrastructure management device, updating the IT device index of the infrastructure management device, a combination of the above, and/or the like. In a second example, indexing may be performed by collecting at least one IT device information for at least one of at least one IT device from at least one of the at least one other infrastructure management device, processing at least one IT device information for at least one of at least one IT device from at least one of the at least one other infrastructure management device, organizing at least one IT device information for at least one of at least one IT device from at least one of the at least one other infrastructure management device, updating the IT device index of at least one of the at least one other infrastructure management device, a combination of the above, and/or the like. The result of the indexing may be stored into the IT device index 555. The IT device index may be performed in numerous ways according to various embodiments. For example, an IT device index may be performed by an in-memory data store, an on-disk data store, a local data store, a remote data store, a distributed data store, a replicated data store, a combination of the above, and/or the like.

Clustering infrastructure management devices and exchanging IT device index information with other infrastructure management devices(s) may be performed at block 640. This clustering may be performed by, for example, a cluster module 560. The clustering of infrastructure management devices may be performed in numerous ways according to various embodiments. For example, a clustering may be performed by configuring one of the clustered infrastructure management devices to name and maintain a list of a multitude of infrastructure manager devices communicatively connected, configuring one of the clustered infrastructure management devices to define at least one credential for a multitude of infrastructure manager devices communicatively connected on at least one named list, configuring one of the clustered infrastructure management devices to define at least one SSL (Secure Socket Layer) certificate for the clustered infrastructure management devices communicatively connected on at least one named list, configuring one of the clustered infrastructure management devices to request a list of the clustered infrastructure management devices communicatively connected on at least one named list, configuring one of the clustered infrastructure management devices to interact to at least one of the clustered infrastructure management devices communicatively connected on at least one named list, providing at least one IT device information of the clustered infrastructure management devices communicatively connected on at least one named list, exchanging at least one IT device index of the clustered infrastructure management devices communicatively connected on at least one named list, a combination of the above, and/or the like. As a result of the clustering, the exchanged IT device index(es) 565 may be available on at least one infrastructure management device communicatively connected.

Searching IT device index information for a list of IT device information based on criteria applied to the IT device index may be performed at block 650. This searching may be performed by, for example, a search module 570. The searching of IT device index information may be performed in numerous ways according to various embodiments. For example, a searching may be performed by conducting a natural language search which may return searched IT device(s) 575 in a tabular representation of the search result, a Web representation of the search results, an organizational tree representation of the search results, a graphical node representation of the search results, a geographic map representation of the search results, a command-line (CLI) representation of the search results, a combination of the above, and/or the like. Additionally, according to a further example, a criteria applied to the IT device index may be a query parameter, a source document index, a source field, a number of matching results to return, a sorting order, a Boolean logic, a filter, a range, a logical condition, an aggregation, a relevance, a combination of the above, and/or the like.

Performing at least one action from possible actions on IT device(s), determined at least in part, by IT device information may be performed at block 660. This action may be performed by, for example, an action module 580. An IT device action(s) 585 may be an operation executed based on the searched IT devices. The IT device action(s) may be performed in numerous ways according to various embodiments. For example, an IT device action(s) may be performed by: executing at least one user defined command on at least one of the at least one IT device over at least one of the at least one communications interface, executing at least one user defined script on at least one of the at least one IT device over at least one of the at least one communications interface, executing at least one user defined program on at least one of the at least one IT device over at least one of the at least one communications interface, executing at least one user defined command on at least one of the at least one IT device locally, executing at least one user defined script on at least one of the at least one IT device locally, executing at least one user defined program on at least one of the at least one IT device locally, executing at least one user defined command on at least one of the at least one other infrastructure management device over the network, executing at least one user defined script on at least one of the at least one other infrastructure management device over the network, executing at least one user defined program on at least one of the at least one other infrastructure management device over the network, executing at least one user defined command on the infrastructure management device locally, executing at least one user defined script the infrastructure management device locally, executing at least one user defined program on the at least one infrastructure management device locally, performing a serial console connection over at least one of the at least one communications interface, performing a serial virtual machine console connection over at least one of the at least one communications interface, performing a SOL (Serial-Over-Lan) console connection over at least one of the at least one communications interface, performing a KVM (Keyboard-Video-Mouse) console connection over at least one of the at least one communications interface, performing a MKS(Mouse-Keyboard-Screen) virtual machine console connection over at least one of the at least one communications interface, performing a power command on at least one of the at least one IT device over at least one of the at least one communications interface, establishing a TCI/IP tunnel between the user's workstation and the infrastructure management device, performing access rights control on commands, performing data log collection on an IT device data session, performing alert and notification based on configuration and data log collection from at least one of the at least one IT device, performing authentication and authorization to a user based on at least one of the following: command, user group and IT device, a combination of the above, and/or the like. In a second example, an IT device action(s) may be performed by: communicating with at least one of the at least one IT device order to verify a device IT state, communicating with at least one of the at least one IT device order to cause a change of the device IT state, a combination of the above, and/or the like. For further clarification, an IT device state may comprise of the following: an IT device power state, an IT device console session state, an IT device login credential state, an IT device configuration state, an IT device Operating System (OS) state, an IT device firmware state, an IT device hosted application state, a combination of the above, and/or the like.

Figure 7:
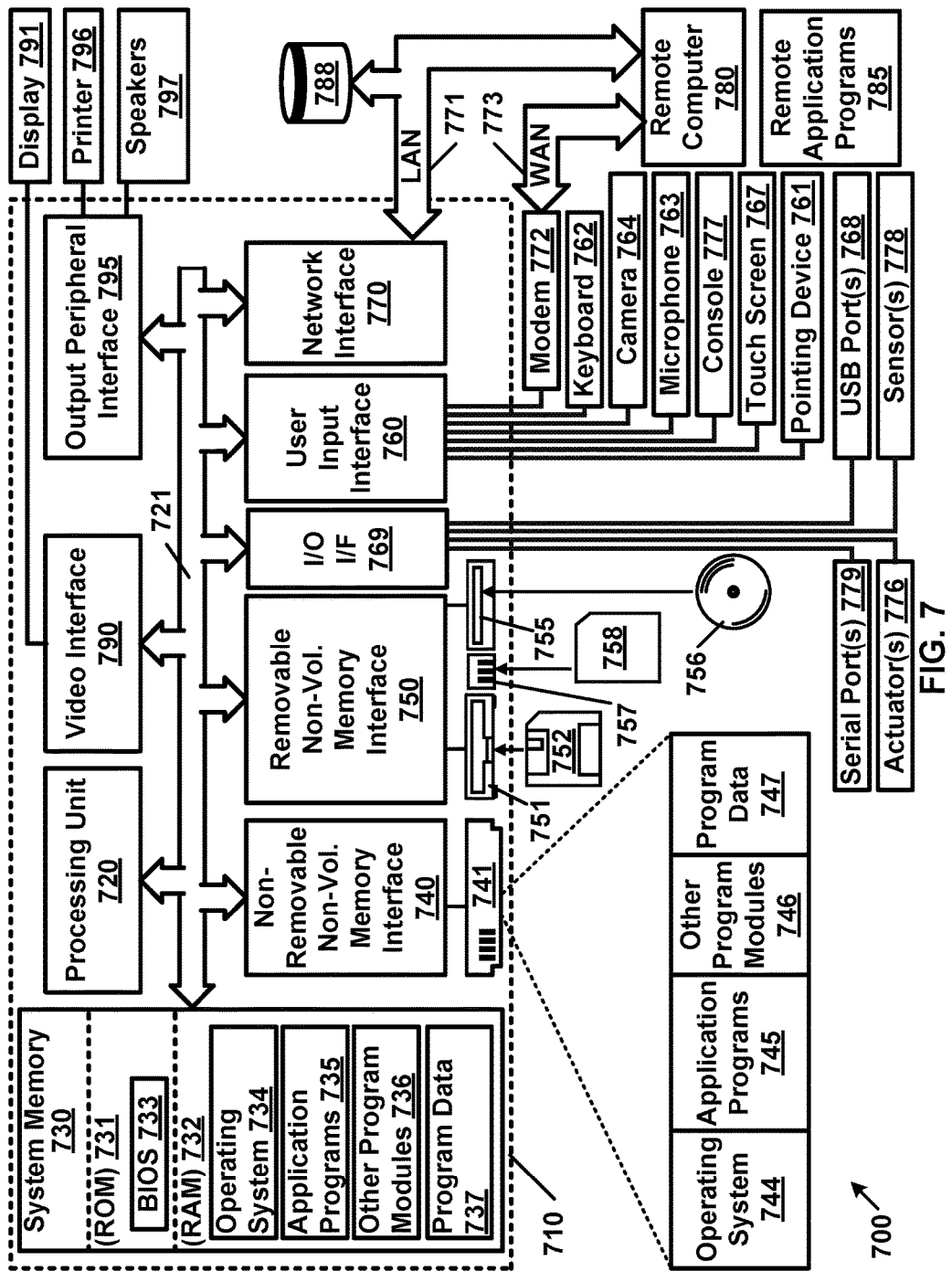
FIG. 7 illustrates an example of a suitable computing system environment on which aspects of some embodiments may be implemented.

FIG. 7 illustrates an example of a suitable computing system environment 700 on which aspects of some embodiments may be implemented. The computing system environment 700 is only one example of a suitable computing environment and is not intended to suggest any limitation as to the scope of use or functionality of the claimed subject matter. Neither should the computing environment 700 be interpreted as having any dependency or requirement relating to any one or combination of components illustrated in the exemplary operating environment 700.

Embodiments are operational with numerous other general purpose or special purpose computing system environments or configurations. Examples of well-known computing systems, environments, and/or configurations that may be suitable for use with various embodiments include, but are not limited to, embedded computing systems, personal computers, server computers, hand-held or laptop devices, multiprocessor systems, microprocessor-based systems, set top boxes, programmable consumer electronics, network PCs, minicomputers, mainframe computers, cloud services, telephony systems, distributed computing environments that include any of the above systems or devices, and the like.

Embodiments may be described in the general context of computer-executable instructions, such as program modules, being executed by computing capable devices. Generally, program modules include routines, programs, objects, components, data structures, etc. that perform particular tasks or implement particular abstract data types. Some embodiments may be designed to be practiced in distributed computing environments where tasks are performed by remote processing devices that are linked through a communications network. In a distributed computing environment, program modules may be located in both local and remote computer storage media including memory storage devices.

With reference to FIG. 7, an example system for implementing some embodiments includes a computing device 710. Components of computer 710 may include, but are not limited to, a processing unit 720, a system memory 730, and a system bus 721 that couples various system components including the system memory to the processing unit 720.

Computer 710 typically includes a variety of computer readable media. Computer readable media can be any available media that can be accessed by computer 710 and includes both volatile and nonvolatile media, and removable and non-removable media. By way of example, and not limitation, computer readable media may comprise computer storage media and communication media. Computer storage media includes both volatile and nonvolatile, and removable and non-removable media implemented in any method or technology for storage of information such as computer readable instructions, data structures, program modules or other data. Computer storage media includes, but is not limited to, random access memory (RAM), read-only memory (ROM), electrically erasable programmable read-only memory (EEPROM), flash memory or other memory technology, compact disc read-only memory (CD-ROM), digital versatile disks (DVD) or other optical disk storage, magnetic cassettes, magnetic tape, magnetic disk storage or other magnetic storage devices, or any other medium which can be used to store the desired information and which can be accessed by computer 710. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer readable media.

The system memory 730 includes computer storage media in the form of volatile and/or nonvolatile memory such as ROM 731 and RAM 732. A basic input/output system 733 (BIOS), containing the basic routines that help to transfer information between elements within computer 710, such as during start-up, is typically stored in ROM 731. RAM 732 typically contains data and/or program modules that are immediately accessible to and/or presently being operated on by processing unit 720. By way of example, and not limitation, FIG. 7 illustrates operating system 734, application programs 735, other program modules 736, and program data 737.

The computer 710 may also include other removable/non-removable volatile/nonvolatile computer storage media. By way of example only, FIG. 7 illustrates a hard disk drive 741 that reads from or writes to non-removable, nonvolatile magnetic media, a magnetic disk drive 751 that reads from or writes to a removable, nonvolatile magnetic disk 752, a flash drive reader 757 that reads flash drive 758, and an optical disk drive 755 that reads from or writes to a removable, nonvolatile optical disk 756 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 741 is typically connected to the system bus 721 through a non-removable memory interface such as interface 740, and magnetic disk drive 751 and optical disk drive 755 are typically connected to the system bus 721 by a removable memory interface, such as interface 750.

The drives and their associated computer storage media discussed above and illustrated in FIG. 7 provide storage of computer readable instructions, data structures, program modules and other data for the computer 710. In FIG. 7, for example, hard disk drive 741 is illustrated as storing operating system 744, application programs 745, program data 747, and other program modules 746. Additionally, for example, non-volatile memory may include instructions to, for example, discover and configure IT device(s), the creation of device neutral user interface command(s), combinations thereof, and/or the like.

A user may enter commands and information into the computer 710 through input devices such as a keyboard 762, a microphone 763, a camera 764, a touch screen 767, console 777 and a pointing device 761, such as a mouse, trackball or touch pad. These and other input devices are often connected to the processing unit 720 through a user input interface 760 that is coupled to the system bus, but may be connected by other interface and bus structures, such as a parallel port, game port or a universal serial bus (USB). A monitor 791 or other type of display device may also connected to the system bus 721 via an interface, such as a video interface 790. Other devices, such as, for example, speakers 797 and printer 796 may be connected to the system via peripheral interface 795.

The computer 710 may also include other input/output devices such as serial ports 779, USB port(s) 768, sensors 778 and actuator(s) 776 that may be used to interact with IT devices. These and other input/output devices are often connected to the processing unit 720 through an Input/Output Interface (I/O I/F) 769 coupled to the system bus, but may also be connected by other interface and bus structures. Examples of the serial communication interfaces may comprise, but are not limited to: RS-232 serial port(s), and RS-485 serial port(s). Serial ports 779 may be implemented in many physical formats, such as, for example DB9, DB25, RJ11, RJ45, and twisted pair (like RS-422).

The computer 710 may be operated in a networked environment using logical connections to one or more remote computers, such as a remote computer 780. The remote computer 780 may be a personal computer, a handheld device, a server, a router, a network PC, a peer device or other common network node, and typically includes many or all of the elements described above relative to the computer 710. The logical connections depicted in FIG. 7 include a local area network (LAN) 771 and a wide area network (WAN) 773, but may also include other networks. Such networking environments are commonplace in offices, enterprise-wide computer networks, intranets and the Internet.

When used in a LAN networking environment, the computer 710 is connected to the LAN 771 through a network interface or adapter 770. When used in a WAN networking environment, the computer 710 typically includes a modem 772 or other means for establishing communications over the WAN 773, such as the Internet. The modem 772, which may be internal or external, may be connected to the system bus 721 via the user input interface 760, or other appropriate mechanism. The modem 772 may be wired or wireless. Examples of wireless devices may comprise, but are limited to: Wi-Fi and Bluetooth™. In a networked environment, program modules depicted relative to the computer 710, or portions thereof, may be stored in the remote memory storage device. By way of example, and not limitation, FIG. 7 illustrates remote application programs 785 as residing on remote computer 780. It will be appreciated that the network connections shown are exemplary and other means of establishing a communications link between the computers may be used. Additionally, for example, LAN 771 and WAN 773 may provide a network interface to communicate with other distributed infrastructure management device(s), with IT device(s) (e.g. network disk drive 788), with users remotely accessing the User Input Interface 760, Input/Output Interface 769, combinations thereof, and/or the like.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

In this specification, "a" and "an" and similar phrases are to be interpreted as "at least one" and "one or more." References to "an" embodiment in this disclosure are not necessarily to the same embodiment.

Many of the elements described in the disclosed embodiments may be implemented as modules. A module is defined here as an isolatable element that performs a defined function and has a defined interface to other elements. The modules described in this disclosure may be implemented in hardware, a combination of hardware and software, firmware, wetware (i.e. hardware with a biological element) or a combination thereof, all of which are behaviorally equivalent. For example, modules may be implemented using computer hardware in combination with software routine(s) written in a computer language (Java, HTML, XML, PHP, Python, ActionScript, JavaScript, Ruby, Prolog, SQL, VBScript, Visual Basic, Perl, C, C++, Objective-C or the like). Additionally, it may be possible to implement modules using physical hardware that incorporates discrete or programmable analog, digital and/or quantum hardware. Examples of programmable hardware include: computers, microcontrollers, microprocessors, application-specific integrated circuits (ASICs), field programmable gate arrays (FPGAs), and complex programmable logic devices (CPLDs). Computers, microcontrollers and microprocessors are programmed using languages such as assembly, C, C++ or the like. FPGAs, ASICs and CPLDs are often programmed using hardware description languages (HDL) such as VHSIC hardware description language (VHDL) or Verilog that configure connections between internal hardware modules with lesser functionality on a programmable device. Finally, it needs to be emphasized that the above mentioned technologies may be used in combination to achieve the result of a functional module.

Some embodiments may employ processing hardware. Processing hardware may include one or more processors, computer equipment, embedded systems, machines a combination thereof, and/or the like. The processing hardware may be configured to execute instructions. The instructions may be stored on a machine-readable medium. According to some embodiments, the machine-readable medium (e.g. automated data medium) may be a medium configured to store data in a machine-readable format that may be accessed by an automated sensing device. Examples of machine-readable media include: magnetic disks, cards, tapes, and drums, flash memory, memory cards, electrically erasable programmable read-only memory (EEPROM), solid state drives, optical disks, barcodes, magnetic ink characters, a combination thereof, and/or the like.

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above described exemplary embodiments. In particular, it should be noted that, for example purposes, the presently described embodiments are discussed with respect to a data center. However, one skilled in the art will recognize that embodiments may be employed to other collections of IT devices over, for example, a distributed network not confined by a single data center, a small collection of IT devices in an Intranet, combinations thereof, and/or the like.

In addition, it should be understood that any figures that highlight any functionality and/or advantages, are presented for example purposes only. The disclosed architecture is sufficiently flexible and configurable, such that it may be utilized in ways other than that shown. For example, the steps listed in any flowchart may be re-ordered or only optionally used in some embodiments.

Further, the purpose of the Abstract of the Disclosure is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract of the Disclosure is not intended to be limiting as to the scope in any way.

Finally, it is the applicant's intent that only claims that include the express language "means for" or "step for" be interpreted under 35 U.S.C. 112. Claims that do not expressly include the phrase "means for" or "step for" are not to be interpreted under 35 U.S.C. 112.

What is claimed is:

1. An infrastructure management device comprising:
a housing with a base plate with first and second parallel edges and third and fourth parallel edges which are perpendicular to the first and second edges, the housing includes a first plate with first plate communication interfaces disposed along the first edge and a second plate with second plate communication interfaces disposed along the second edge; and
a circuit board disposed on the base plate, wherein the circuit board is electrically coupled to the first and second plate communication interfaces, the circuit board includes a processor unit and a memory unit, wherein the processor unit includes a configuration module, a discovery module and an index module, wherein the processor unit is configured to operate with the configuration module, the discovery module and the index module to configure, discover and index at least one external device coupled to the infrastructure management device via the first and second plate communication interfaces.

2. The infrastructure management device of claim 1 wherein the first plate communication interfaces include at least 8 first plate communication interfaces.

3. The infrastructure management device of claim 2 wherein the at least 8 first plate communication interfaces comprise at least 8 universal serial bus (USB) ports.

4. The infrastructure management device of claim 1 wherein the second plate communication interfaces include at least 6 second plate communication interfaces.

5. The infrastructure management device of claim 3 wherein the at least 6 second plate communication interfaces comprise at least 6 universal serial bus (USB) ports.

6. The infrastructure management device of claim 1 wherein the first plate comprises at least two adjacent first rows of at least 16 first plate communication interfaces disposed along a length of the first plate.

7. The infrastructure management device of claim 1 wherein the second plate comprises at least two adjacent second rows of at least 16 second plate communication interfaces along a length of the second plate.

8. The infrastructure management device of claim 1 wherein one of the first and second plates comprises a front plate and other of the first and second plates comprises a rear plate.

9. The infrastructure management device of claim 1 wherein the first and second plate communication interfaces comprise:
one or more null-modem serial ports;
one or more data Communications Equipment (DCE) serial ports;
one or more data Terminal Equipment (DTE) serial ports;
one or more Cisco pinout serial ports;
one or more Cyclades pinout serial ports;
one or more straight-through serial ports;
one or more cross-over serial ports;
one or more RJ45 ports;
one or more RS-232 serial ports;
one or more RS-485 serial ports;
one or more universal serial bus (USB) ports;
one or more serial ports;
one or more Local Area Network (LAN) ports;
one or more Wide Area Network Area (WAN) ports;
one or more Wi-Fi wireless Network ports; or
a combination thereof.

10. The infrastructure management device of claim 1 wherein the circuit board comprises a carrier input/output (I/O) board with an I/O interface, the I/O interface is configured to logically map I/O signals received from the first and second plate communication interfaces when the at least one external device is coupled thereto.

11. The infrastructure management device of claim 1 wherein the discovery module comprises a discovery engine for discovering the at least one external device coupled to the infrastructure management device using a discovery service.

12. The infrastructure management device of claim 11 wherein:
the memory unit stores information of the at least one external device identified by the discovery engine; and
the configuration module uses the information in the memory unit to configure and manage the at least one external device.

* * * * *

UNITED STATES PATENT AND TRADEMARK OFFICE
CERTIFICATE OF CORRECTION

| | |
|---|---|
| PATENT NO. | : 10,164,385 B2 |
| APPLICATION NO. | : 15/862582 |
| DATED | : December 25, 2018 |
| INVENTOR(S) | : Arnaldo Zimmermann and Livio Ceci |

It is certified that error appears in the above-identified patent and that said Letters Patent is hereby corrected as shown below:

In the Claims

Column 20, Line 10: replace "claim 3" with "claim 4"

Signed and Sealed this
Eleventh Day of June, 2019

Andrei Iancu
*Director of the United States Patent and Trademark Office*